(12) United States Patent
Asano et al.

(10) Patent No.: US 11,855,384 B2
(45) Date of Patent: Dec. 26, 2023

(54) CONNECTOR INCLUDING PROTRUDING PORTION AND INCLINATION RESTRICTING PORTION

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yasunori Asano, Mie (JP); Motoki Kubota, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 177 days.

(21) Appl. No.: 17/439,249

(22) PCT Filed: Jan. 8, 2020

(86) PCT No.: PCT/JP2020/000288
§ 371 (c)(1),
(2) Date: Sep. 14, 2021

(87) PCT Pub. No.: WO2020/194989
PCT Pub. Date: Oct. 1, 2020

(65) Prior Publication Data
US 2022/0149562 A1      May 12, 2022

(30) Foreign Application Priority Data
Mar. 27, 2019   (JP) .................................. 2019-061542

(51) Int. Cl.
*H01R 13/46*         (2006.01)
*H01R 13/533*        (2006.01)
(Continued)

(52) U.S. Cl.
CPC ......... *H01R 13/533* (2013.01); *H01R 12/716* (2013.01); *H01R 13/5202* (2013.01)

(58) Field of Classification Search
CPC   H01R 13/533; H01R 12/716; H01R 13/5202; H01R 13/41; H01R 13/6658;
(Continued)

(56) References Cited

U.S. PATENT DOCUMENTS 5,415,569 A * 5/1995 Colleran ............ H01R 13/7195
                                                   333/182
6,257,914 B1    7/2001 Comerci et al.
(Continued)

FOREIGN PATENT DOCUMENTS

JP     2014-194854 A     10/2014

OTHER PUBLICATIONS

International Search Report dated Mar. 17, 2020 for WO 2020/194989 A1 (4 pages).

*Primary Examiner* — Abdullah A Riyami
*Assistant Examiner* — Nelson R. Burgos-Guntin
(74) *Attorney, Agent, or Firm* — Venjuris, P.C.

(57) ABSTRACT

It is aimed to improve anti-vibration performance. A connector includes a case made of metal and including an opening, and a terminal holding member made of synthetic resin for holding terminal fittings, the terminal holding member being integrated with the case while penetrating through the opening. The opening 18 includes a protruding portion protruding inward toward an outer periphery of the terminal holding member. The terminal holding member includes an inclination restricting portion to be held in
(Continued)

contact with at least one of an outer surface and an inner surface of the protruding portion. Since the inclination restricting portion is in contact with the protruding portion, the inclination of the terminal holding member with respect to the case is suppressed even if the terminal holding member is subjected to vibration.

8 Claims, 10 Drawing Sheets

(51) Int. Cl.
*H01R 12/71* (2011.01)
*H01R 13/52* (2006.01)
(58) Field of Classification Search
CPC ... H01R 12/724; H01R 13/504; H05K 5/0069
See application file for complete search history.

(56) References Cited

U.S. PATENT DOCUMENTS

| | | | | |
|---|---|---|---|---|
| 7,201,587 B1* | 4/2007 | Eichorn | ............... | H01R 12/724 439/79 |
| 8,979,554 B2* | 3/2015 | Yudate | ............... | H01R 13/5202 439/732 |
| 9,099,815 B2* | 8/2015 | Kashiwada | ............ | H01R 12/00 |
| 10,826,228 B2* | 11/2020 | Lee | .................... | H01R 13/5025 |
| 2002/0142657 A1 | 10/2002 | Nishio et al. | | |
| 2005/0020104 A1* | 1/2005 | Yamamoto | ......... | H01R 13/4361 439/76.1 |
| 2005/0152084 A1* | 7/2005 | Blasko | ................. | H05K 5/0069 361/100 |
| 2010/0300723 A1* | 12/2010 | Ambo | .................. | H05K 5/0069 174/59 |
| 2012/0015549 A1* | 1/2012 | Youn | .................. | H01R 13/6583 439/374 |
| 2012/0295469 A1* | 11/2012 | Takeda | ................. | H01R 13/629 439/377 |
| 2012/0322285 A1* | 12/2012 | Homme | ............. | H01R 13/6658 439/271 |
| 2013/0242484 A1* | 9/2013 | Schweichart | ........ | H05K 5/0069 361/679.01 |
| 2013/0313753 A1* | 11/2013 | Scheel | .................... | H05K 5/063 264/272.14 |
| 2014/0065877 A1* | 3/2014 | Ohhashi | ............. | H01R 13/5213 439/519 |
| 2014/0120767 A1* | 5/2014 | Itsuki | ................. | H01R 13/5202 439/587 |
| 2015/0244097 A1* | 8/2015 | Hirayama | .......... | H01R 13/5202 439/660 |
| 2015/0357886 A1* | 12/2015 | Ishizeki | ................ | F04C 11/008 310/71 |
| 2016/0099523 A1 | 4/2016 | Miyoshi | | |
| 2017/0171995 A1* | 6/2017 | Lee | ....................... | H05K 5/0017 |
| 2017/0223847 A1* | 8/2017 | Nishida | ................. | H05K 5/0213 |
| 2017/0223854 A1* | 8/2017 | Nishida | ................. | H05K 5/069 |
| 2017/0238435 A1* | 8/2017 | Hashimoto | .......... | H05K 5/0052 361/714 |
| 2020/0106211 A1* | 4/2020 | Lee | ....................... | H01R 13/5025 |
| 2020/0303987 A1* | 9/2020 | Stubner | ................. | H02K 15/14 |
| 2021/0218181 A1* | 7/2021 | Hara | .................... | H01R 13/504 |
| 2022/0200195 A1* | 6/2022 | Asano | ................. | H01R 13/504 |
| 2023/0084744 A1* | 3/2023 | Ono | ..................... | H01R 13/405 439/625 |

* cited by examiner

CONNECTOR INCLUDING PROTRUDING PORTION AND INCLINATION RESTRICTING PORTION

CROSS REFERENCE TO RELATED APPLICATIONS

This application is a national phase of PCT application No. PCT/JP2020/000288, filed on 8 Jan. 2020, which claims priority from Japanese patent application No. 2019-061542, filed on 27 Mar. 2019, all of which are incorporated herein by reference.

TECHNICAL FIELD

The present disclosure relates to a connector.

BACKGROUND

Patent Document 1 discloses a connector with a terminal holding member made of synthetic resin for holding terminal fittings and a case for accommodating board connecting portions of the terminal fittings. The terminal holding member and the case are integrated by insert molding. The board connecting portions of the terminal fittings are fixed to a circuit board covered by the case. Harness connecting portions of the terminal fittings are arranged outside the case and connected to a wiring harness.

PRIOR ART DOCUMENT

Patent Document
Patent Document 1: JP 2014-194854 A

SUMMARY OF THE INVENTION

Problems to be Solved

Since not only the terminal holding member, but also the case are made of synthetic resin in the connector of Patent Document 1, heat generated inside the case is easily accumulated in the case. As a countermeasure against this, it is considered to make the case of metal and integrate the case and the terminal holding member made of synthetic resin by insert molding. Since the metal is better in thermal conductivity than the synthetic resin, the heat in the case can be dissipated to the atmosphere from the outer surfaces of the case.

However, affinity (adhesion) between the metal and the synthetic resin, which are different types of materials, is not high. Thus, when the terminal holding member is subjected to vibration, a clearance may be formed between the terminal holding member and the case and the terminal holding member and the case may be repeatedly relatively displaced. If the terminal holding member and the case are repeatedly relatively displaced, a stress concentrates on the terminal fittings to apply a load, for example, if the board connecting portions of the terminal fittings held in the terminal holding member and the circuit board fixed to the case are fixed. Thus, anti-vibration measures are necessary.

A connector of the present disclosure was completed on the basis of the above situation and aims to improve anti-vibration performance.

Means to Solve the Problem

The present disclosure is directed to a connector with a case made of metal and including an opening, and a terminal holding member made of synthetic resin for holding a terminal fitting, the terminal holding member being integrated with the case while penetrating through the opening, wherein the opening includes a protruding portion protruding inward toward an outer periphery of the terminal holding member, and the terminal holding member includes an inclination restricting portion to be held in contact with at least one of an outer surface and an inner surface of the protruding portion.

Effect of the Invention

According to the present disclosure, it is possible to improve anti-vibration performance.

DETAILED DESCRIPTION TO EXECUTE THE INVENTION

Description of Embodiments of Present Disclosure

First, embodiments of the present disclosure are listed and described.

(1) The connector of the present disclosure includes a case made of metal and including an opening, and a terminal holding member made of synthetic resin for holding a terminal fitting, the terminal holding member being integrated with the case while penetrating through the opening, wherein the opening includes a protruding portion protruding inward toward an outer periphery of the terminal holding member, and the terminal holding member includes an inclination restricting portion to be held in contact with at least one of an outer surface and an inner surface of the protruding portion.

According to this configuration, since the inclination restricting portion is in contact with the protruding portion, the inclination of the terminal holding member with respect to the case is suppressed even if the terminal holding member is subjected to vibration. According to the present disclosure, anti-vibration performance can be improved.

(2) Preferably, the inclination restricting portion is in contact with the outer and inner surfaces of the protruding portion. According to this configuration, since the inclination restricting portion sandwiches the protruding portion, the inclination of the terminal holding member with respect to the case can be effectively suppressed without complicating the structure.

(3) Preferably, the terminal holding member includes a primary molded portion integrated with the terminal fitting and a secondary molded portion integrated with the primary molded portion, and the inclination restricting portion is formed on the secondary molded portion. According to this configuration, in the shape design of the secondary molded portion, the reliable contact of the inclination restricting portion with the protruding portion can be prioritized over the influence of an injection pressure on the terminal fitting. Therefore, the inclination restricting portion can be reliably brought into contact with the protruding portion.

(4) Preferably, the secondary molded portion includes an interposed portion for filling up a clearance between the primary molded portion and the case, and the interposed portion is formed with the inclination restricting portion. According to this configuration, the primary molded portion and the case can be integrated via the interposed portion. Since the interposed portion also functions as the inclination restricting portion, the structure can be simplified.

(5) Preferably, a fitting portion having an irregular shape is formed on a contact surface of the primary molded portion with the secondary molded portion. According to this configuration, the primary molded portion and the secondary molded portion can be reliably integrated. Example of the "irregular shape" of the fitting portion include a shape formed by alternately arranging recesses and projections having the same width at constant intervals, a shape formed by alternately arranging narrow recesses and width projections, a shape formed by alternately arranging wide recesses and narrow projections, a shape formed by aligning or randomly arranging recesses and the projections on a two-dimensional plane, a shape formed with only a plurality of recesses, a shape formed with only a plurality of projections, a shape formed with slit-like restricting recesses and a shape formed with rib-like projections.

(6) Preferably, the protruding portion is provided with a sealing member for sealing a clearance between the terminal holding member and the protruding portion in a liquid-tight manner over an entire periphery. According to this configuration, sealing can be provided between the case and the terminal holding member in a liquid-tight manner.

Details of Embodiments of Present Disclosure

Embodiment

Hereinafter, one specific embodiment of a connector 10 of the present disclosure is described with reference to FIGS. 1 to 10. Note that, in the following description, a right side in FIGS. 1, 3, 4 and 7 to 10 and an upper side in FIGS. 5 and 6 are defined as a front side concerning a front-rear direction. Further, upper and lower sides shown in FIGS. 1 to 4 and 7 to 10 are directly defined as upper and lower sides concerning a vertical direction.

Figure 1:
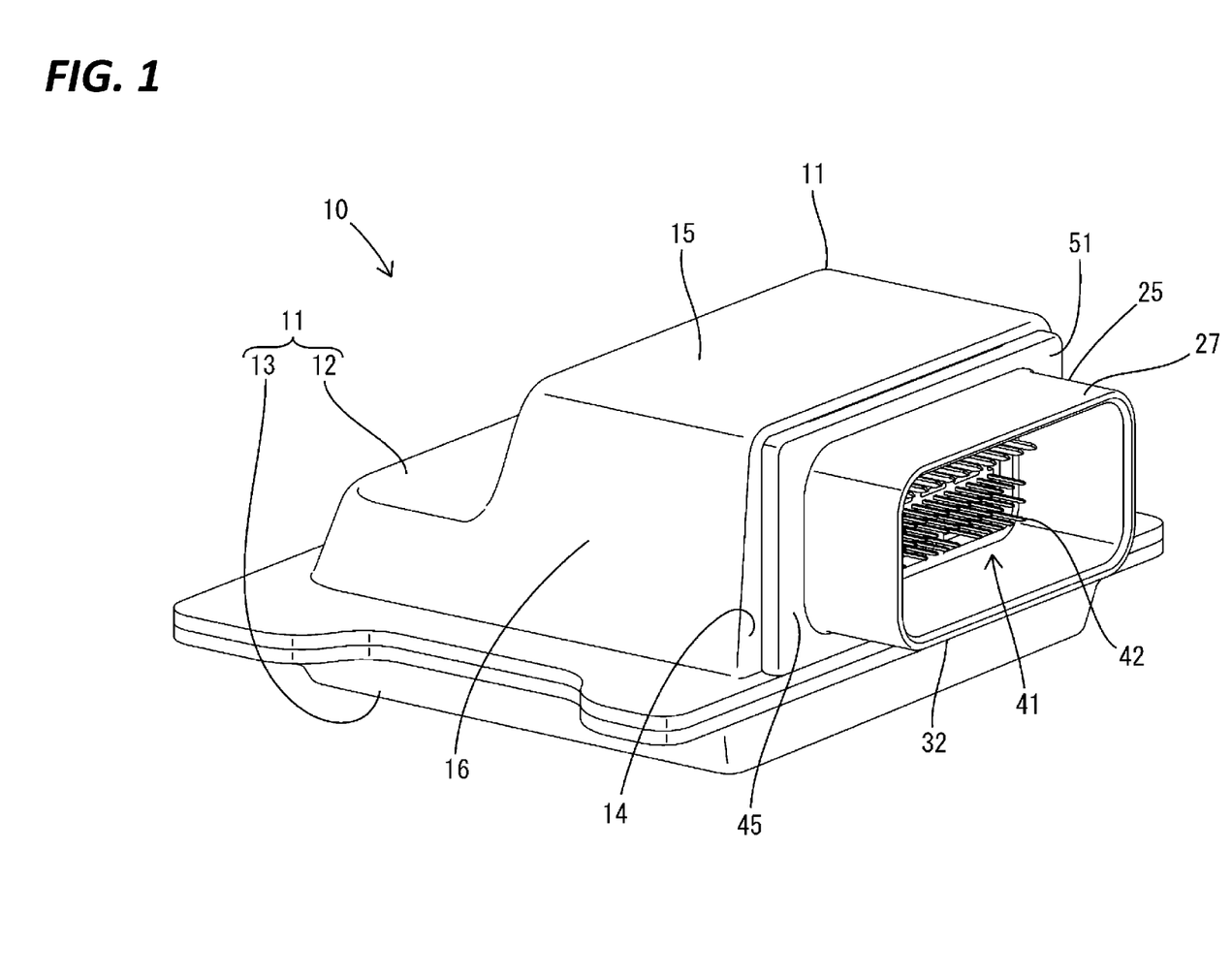
FIG. 1 is a perspective view of a connector of one embodiment.
Figure 2:
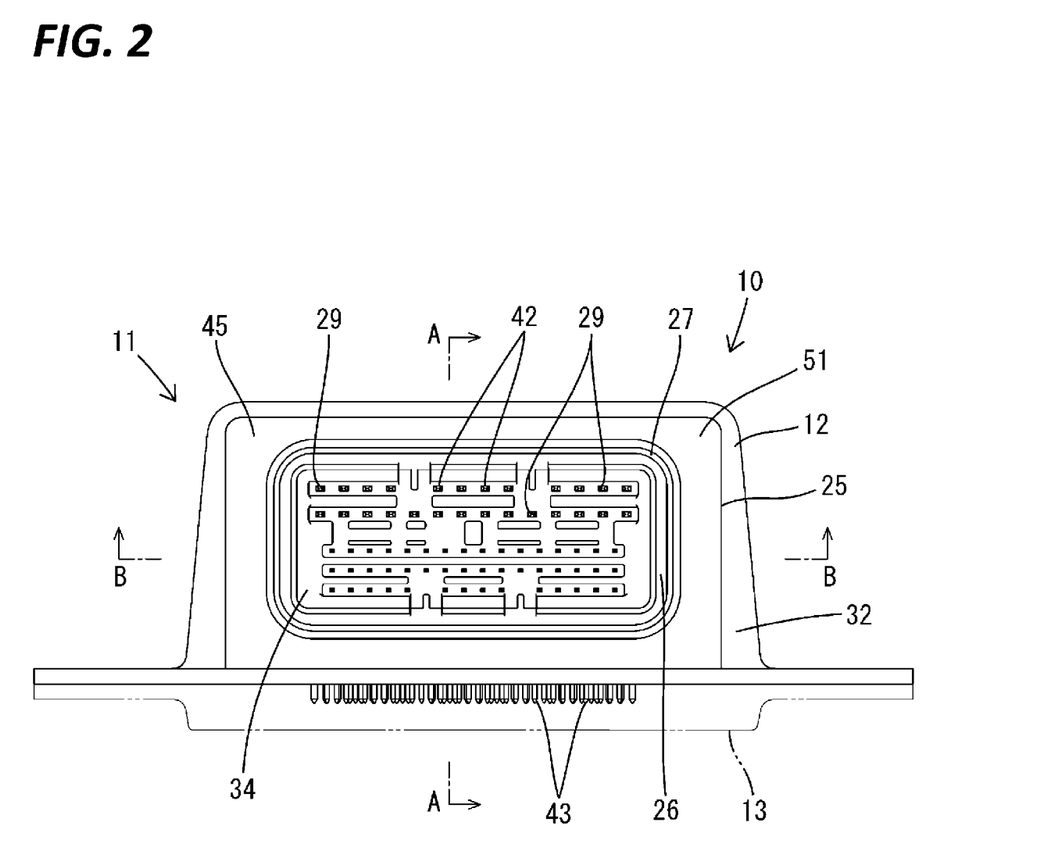
FIG. 2 is a front view of the connector.
Figure 3:
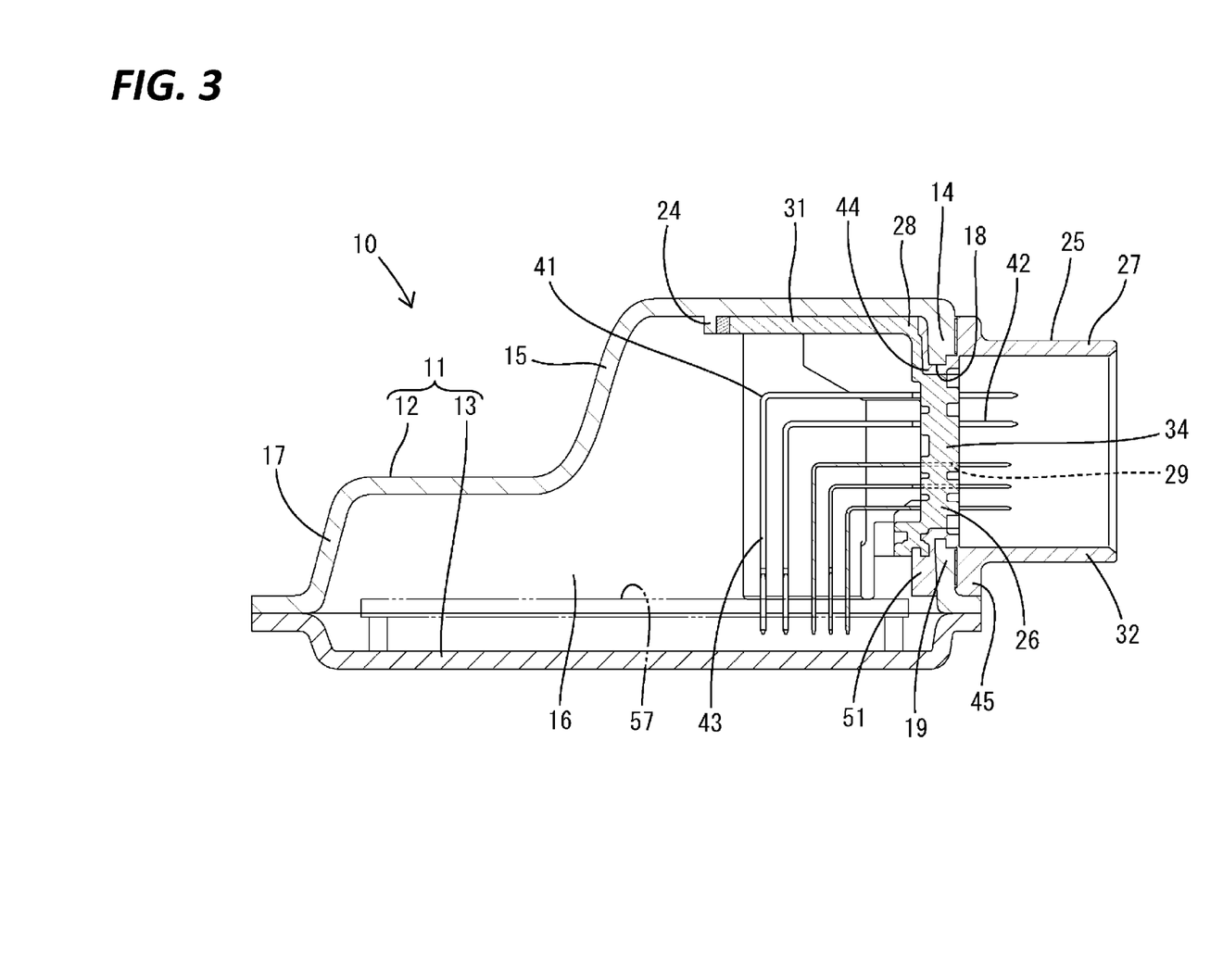
FIG. 3 is a section along A-A of FIG. 2.
Figure 7:
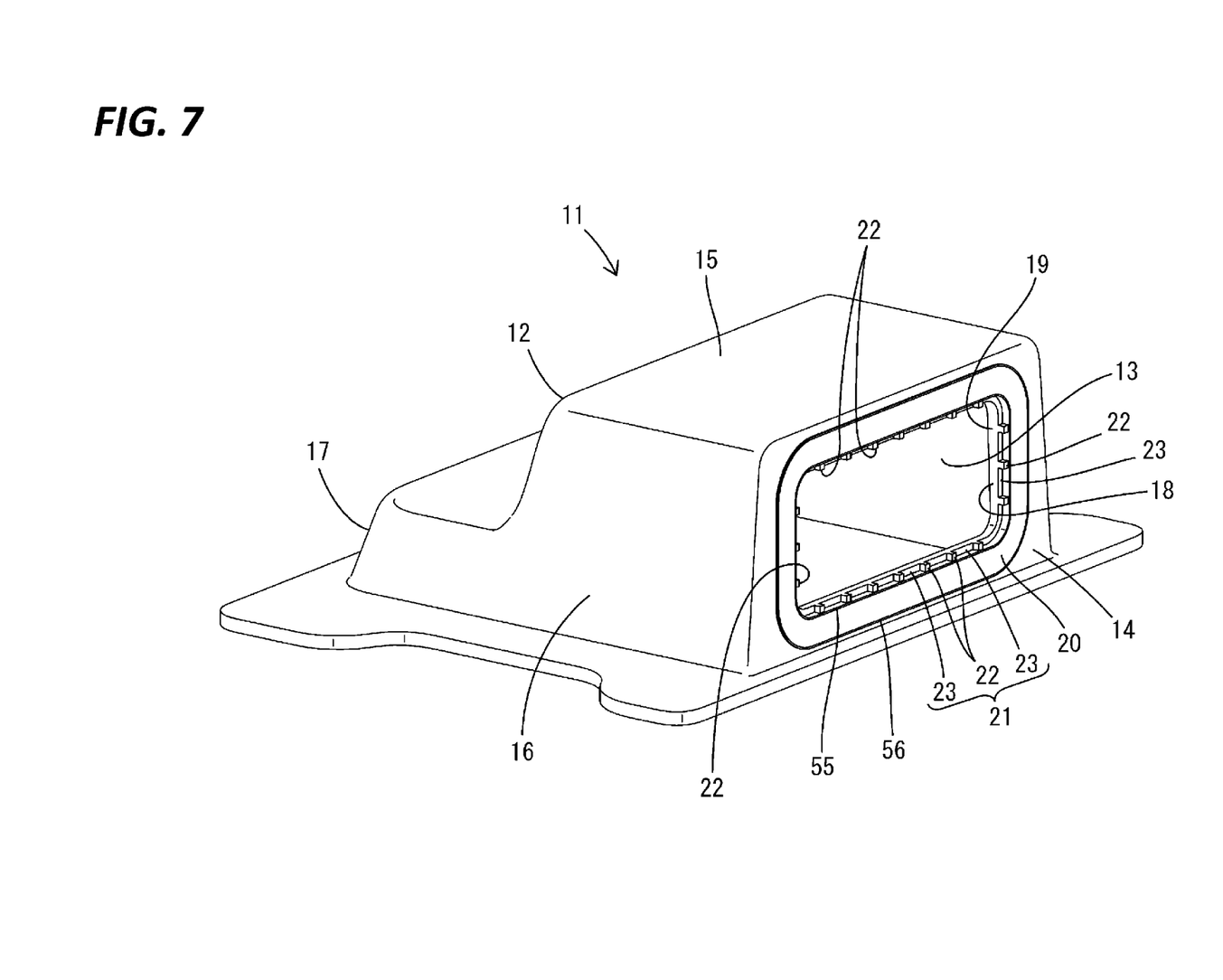
FIG. 7 is a perspective view of a case.

The connector 10 of this embodiment includes a case 11 made of metal, a terminal holding member 25 made of synthetic resin, a plurality of terminal fittings 41 and a circuit board 57. As shown in FIGS. 1 to 3, the case 11 is configured by vertically uniting an upper case 12 and a lower case 13. The upper case 12 is a single component having a front plate portion 14, an upper plate portion 15, a pair of left and right side plate portions 16 and a rear plate portion 17. A plate thickness direction of the front plate portion 14 is aligned with the front-rear direction. As shown in FIG. 7, the front plate portion 14 is formed with an opening 18 having a laterally long rectangular shape in a front view as a whole. The opening 18 penetrates through the front plate portion 14 in the front-rear direction.

The upper plate portion 15 is so shaped that a front end side region is higher than a rear end side region. The side plate portions 16 extend downward from both left and right side edges of the upper plate portion 15. The rear plate portion 17 extends downward from the rear end edge of the upper plate portion 15 and is connected to the rear end edges of the both left and right side plate portions 16. As shown in FIGS. 3 and 5, a projection-like stopper 24 is formed on the inner surface of the upper plate portion 15. The lower case 13 is in the form of a shallow dish having a rectangular shape in a plan view.

As shown in FIG. 3, the internal space of the upper case 12 is open in the entire lower surface region of the upper case 12. The lower case 13 is fixed to the upper case 12 to close the internal space of the upper case 12 from below. The circuit board 57 is horizontally mounted on the upper surface of the lower case 13. When the lower case 13 is assembled with the upper case 12, the internal space of the case 11 is open forward of the case 11 in the opening 18. The circuit board 57 is arranged behind the front plate portion 14 (opening 18) in the case 11.

Figure 4:
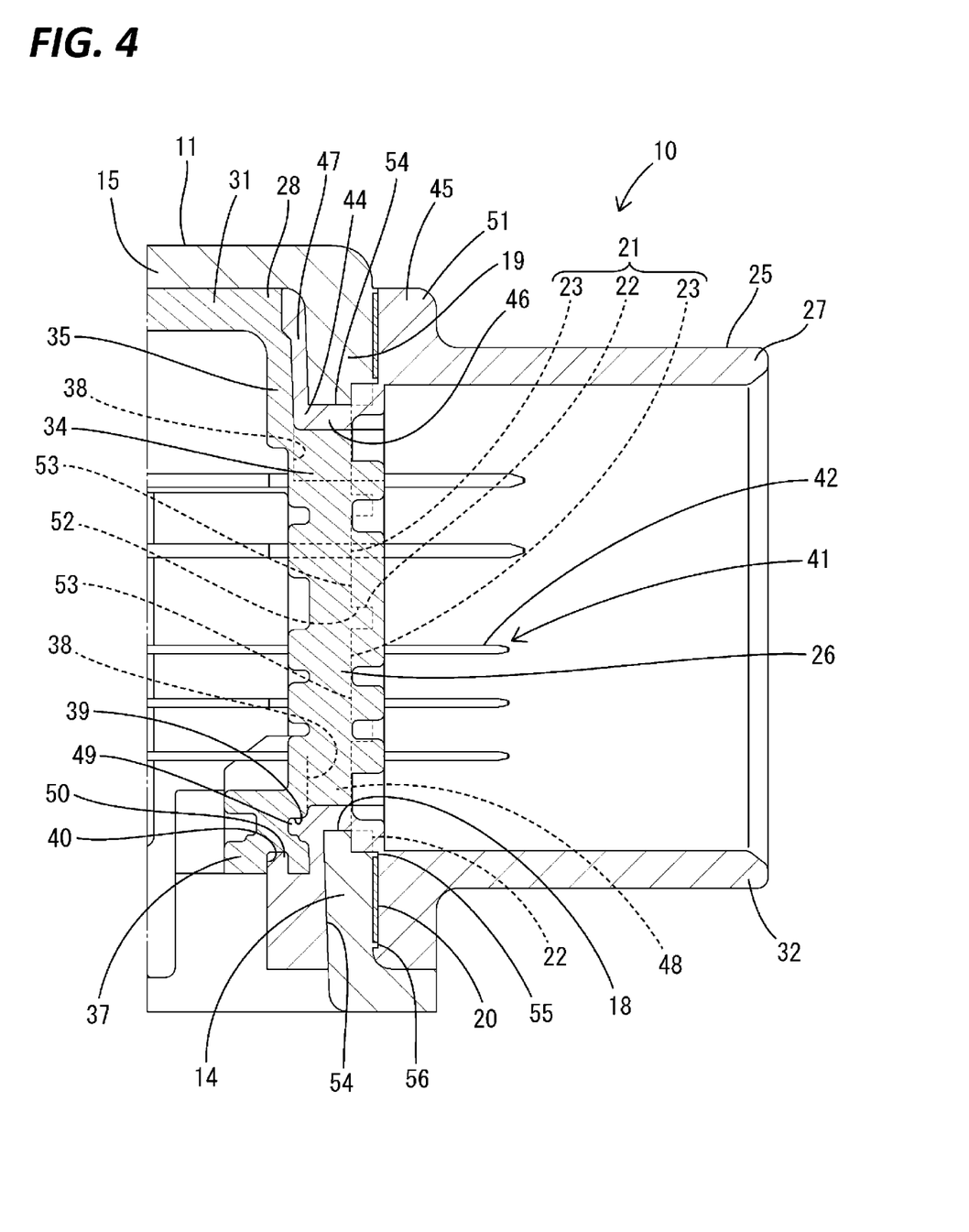
FIG. 4 is a partial enlarged section of FIG. 3.
Figure 5:
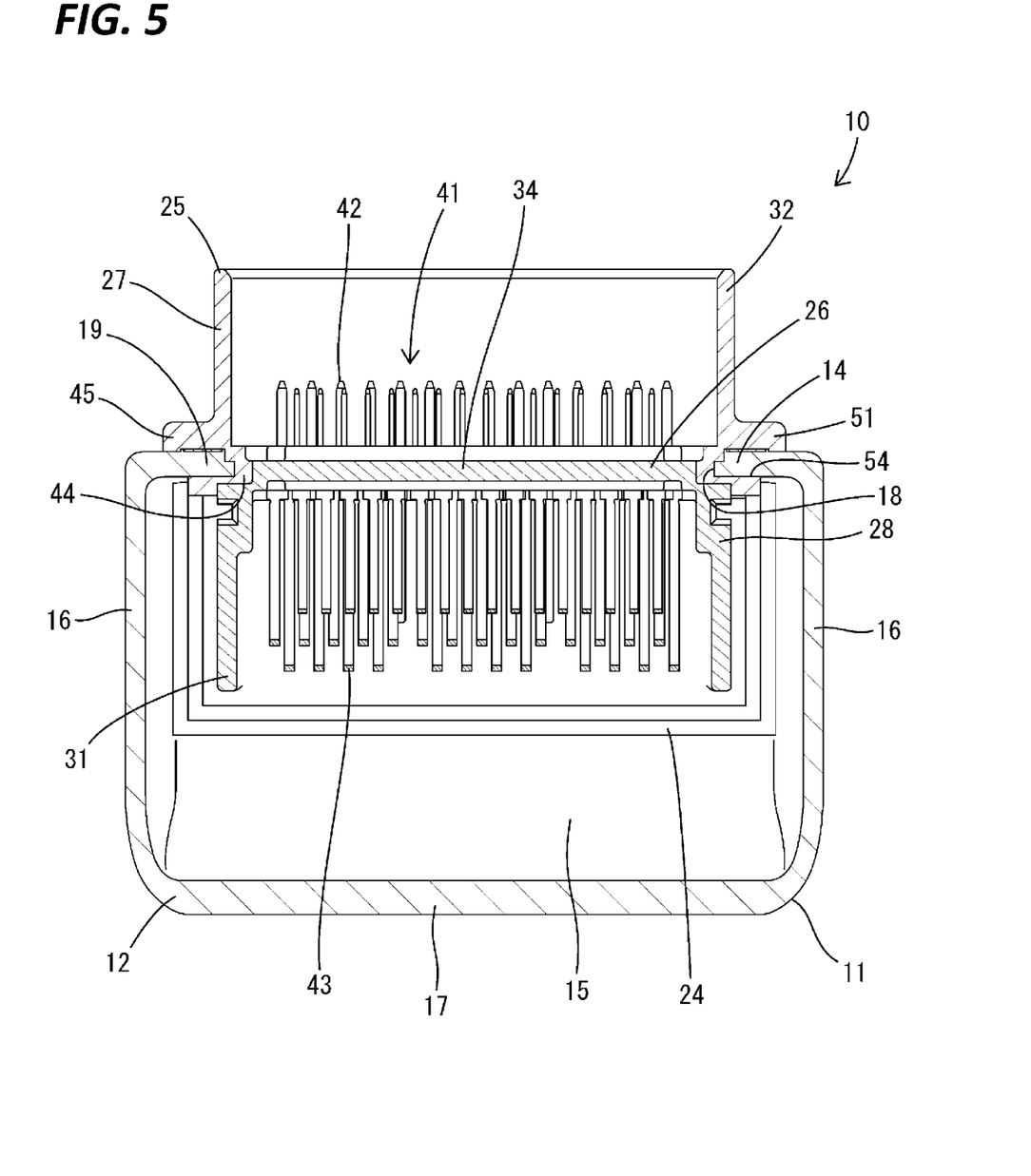
FIG. 5 is a section along B-B of FIG. 2.
Figure 6:
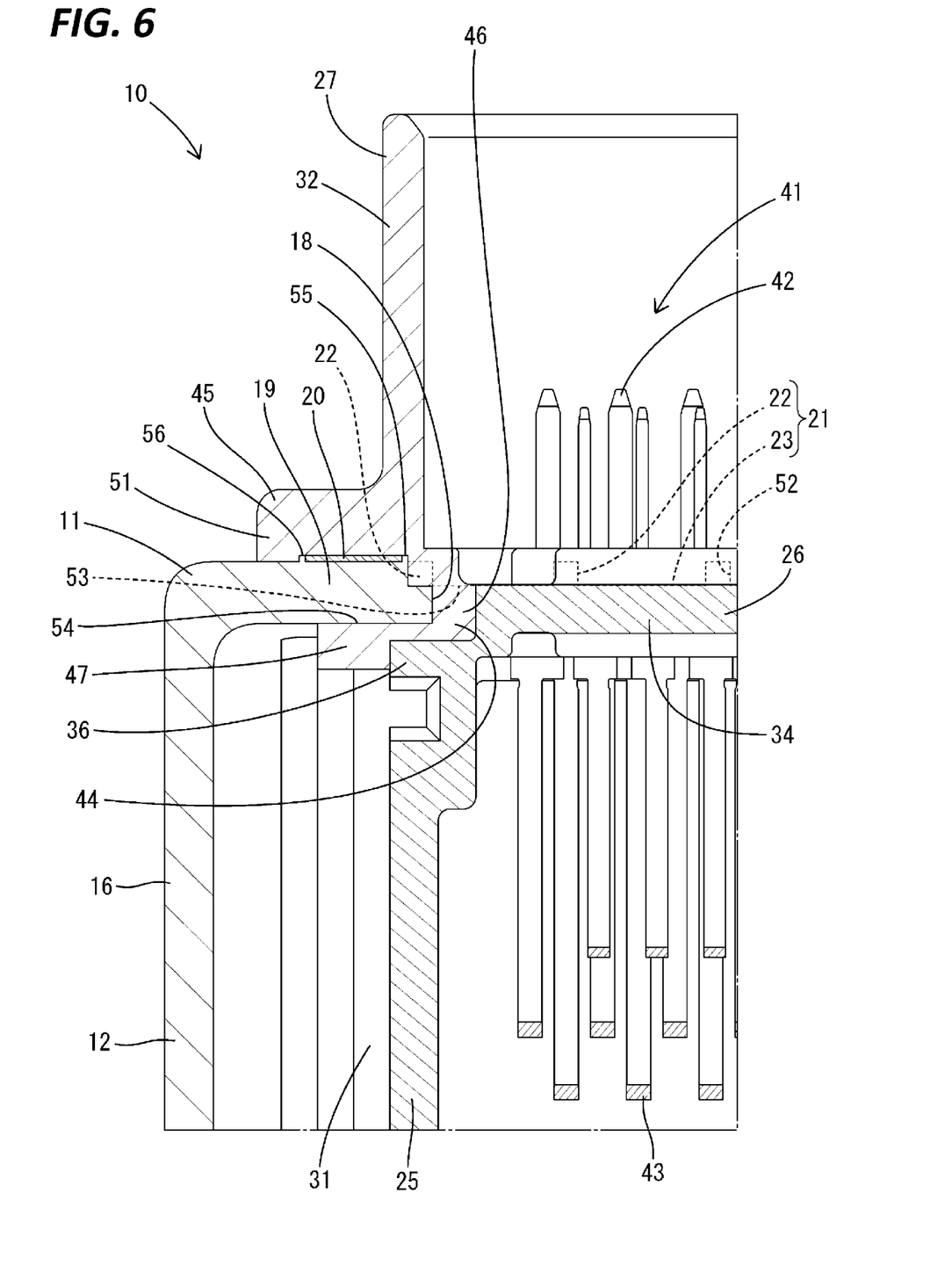
FIG. 6 is a partial enlarged section of FIG. 5.

As shown in FIGS. 3 to 7, a rectangular frame-like region of the front plate portion 14 constituting an opening edge part of the opening 18 serves as a protruding portion 19. The protruding portion 19 is formed over the entire periphery of the opening 18. The protruding portion 19 is plate-like and a plate thickness direction thereof is aligned with the front-rear direction (direction of communication between the inside and outside of the case 11 in the opening 18). As shown in FIGS. 4, 6 and 7, an inner peripheral rib-like projection 55 and an outer peripheral rib-like projection 56 extending along a circumferential direction of the opening 18 are formed on the front surface (outer surface) of the protruding portion 19. The inner and outer peripheral rib-like projections 55, 56 are continuous over the entire periphery and have a rectangular frame shape. The outer peripheral rib-like projection 56 is disposed on an outer peripheral side of the inner peripheral rib-like projection 55.

A region between the inner and outer peripheral rib-like projections 55, 56 on the front surface of the protruding portion 19 serves as a shallow sealing recess. As shown in FIGS. 4, 6 and 7, a sealing member 20 (adhesive) in the form of a rectangular frame continuous over the entire periphery of the protruding portion 19 is provided in the sealing recess.

As shown in FIGS. 4 to 6, the protruding portion 19 projects toward the outer peripheral surface of the terminal holding member 25 penetrating through the opening 18 in the front-rear direction. Any of the front surface (outer surface), rear surface (inner surface) and inner peripheral surface of the protruding portion 19 serves as a contact surface to be held in close contact with the outer peripheral surface of the terminal holding member 25 (secondary molded portion 32) to be described later by insert molding. The protruding portion 19 is so integrated as to bite into the outer periphery of the terminal holding member 25.

A displacement restricting portion 21 is formed over an entire periphery in a rectangular region (region adjacent to the inner peripheral edge of a sealing surface) on an inner peripheral side on the front surface (outer surface) of the protruding portion 19. The displacement restricting portion 21 includes a plurality of restricting projections 22 and a plurality of restricting recesses 23. The restricting projections 22 are shaped to have a relatively small width in the circumferential direction and in the form of rectangular parallelepipeds or cubes projecting forward from the front surface of the protruding portion 19. The restricting recesses 23 are shaped to have a larger width than the restricting projections 22 in the circumferential direction. The displacement restricting portion 21 is formed such that the plurality of restricting projections 22 and the plurality of restricting recesses 23 are alternately arranged in the circumferential direction.

As shown in FIGS. 3 to 5, the terminal holding member 25 includes a terminal penetrating portion 26, a receptacle 27 and a protecting portion 28. As shown in FIG. 3, the terminal penetrating portion 26 is formed with a plurality of press-fit holes 29 penetrating in the front-rear direction. The receptacle 27 is in the form of a rectangular tube projecting forward from the outer peripheral edge of the terminal penetrating portion 26. The protecting portion 28 projects rearward from the upper edge and both left and right side edges of the terminal penetrating portion 26. The protecting portion 28 is in the form of a box with open lower and rear surfaces. The front end of the protecting portion 28 is connected to the outer peripheral edge of a front wall portion 33.

Figure 8:
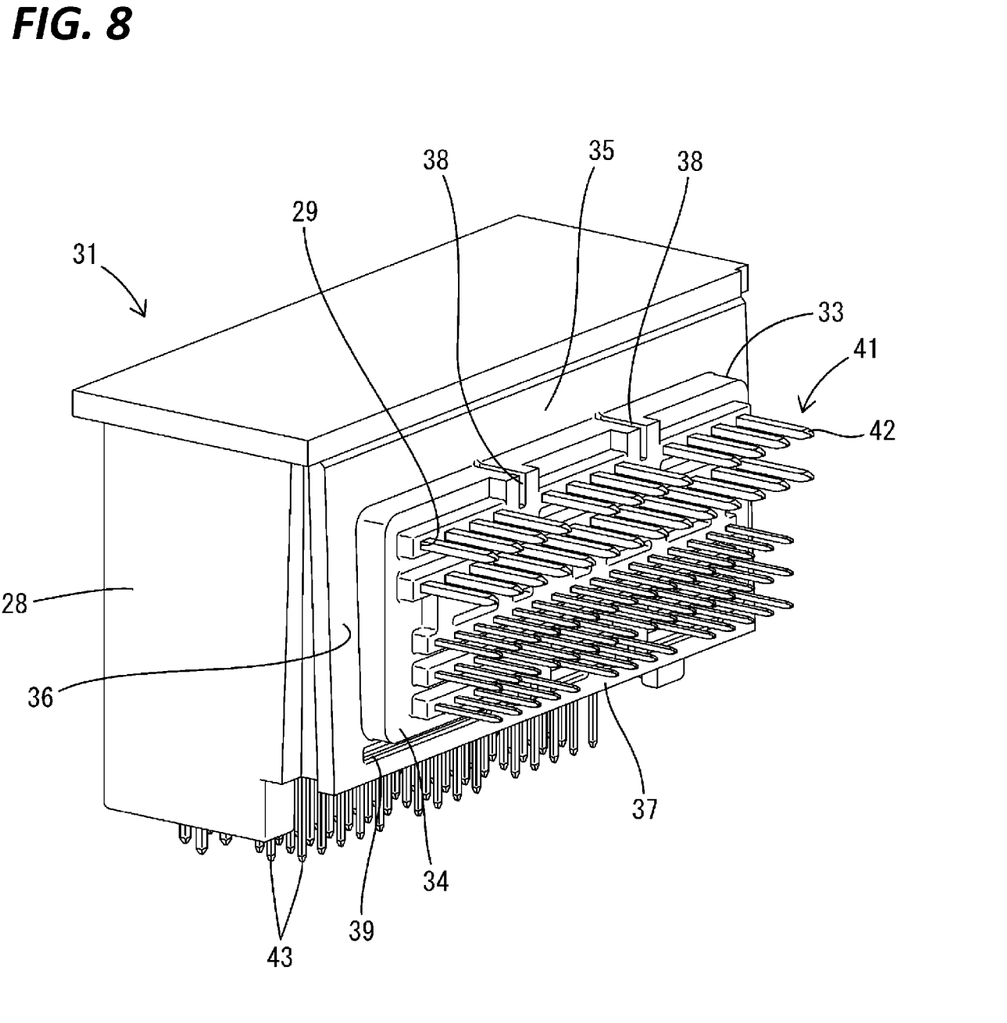
FIG. 8 is a perspective view of a primary molded portion obliquely viewed from an upper-front side.
Figure 9:
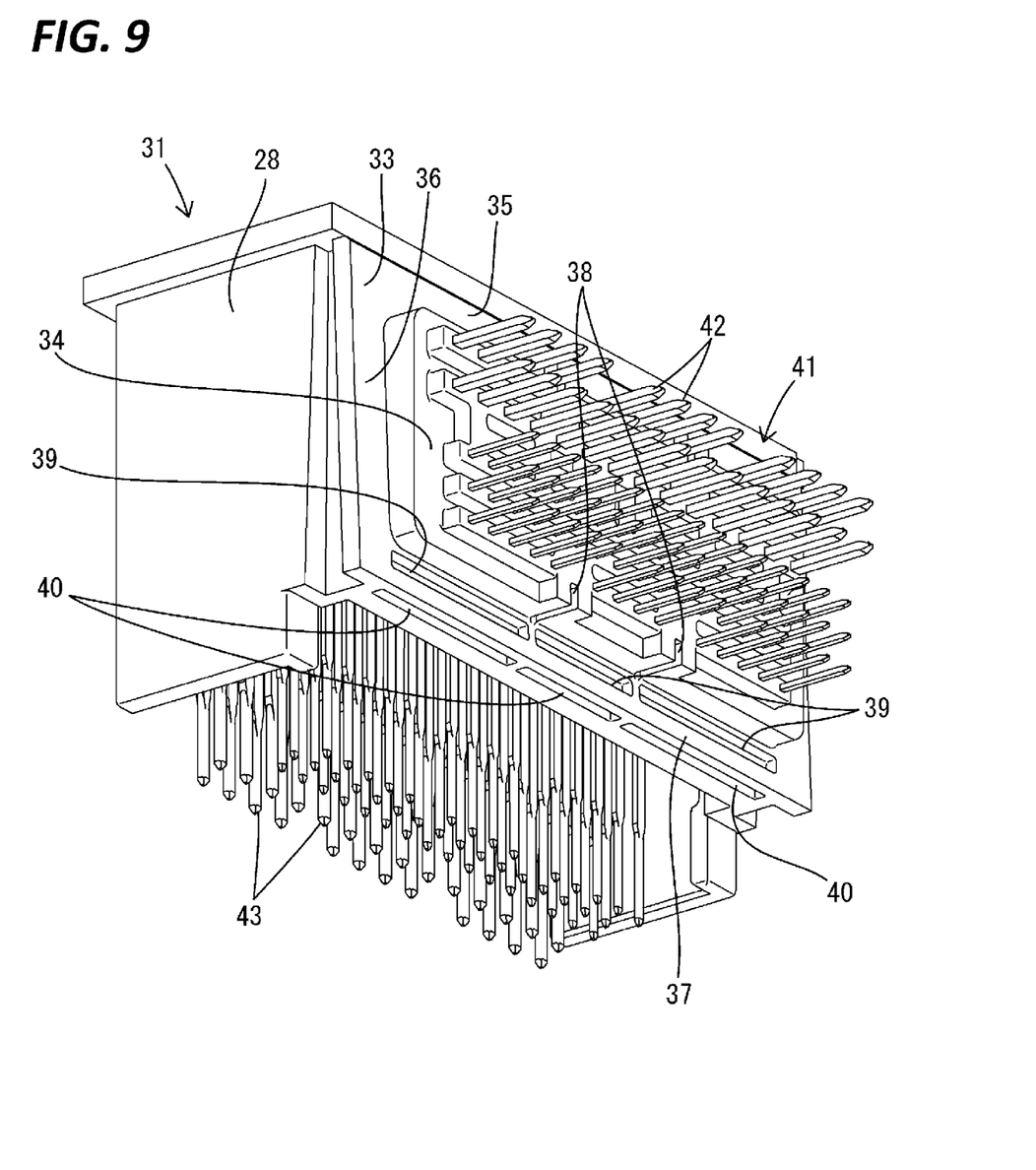
FIG. 9 is a perspective view of the primary molded portion obliquely viewed from a lower-front side.
Figure 10:
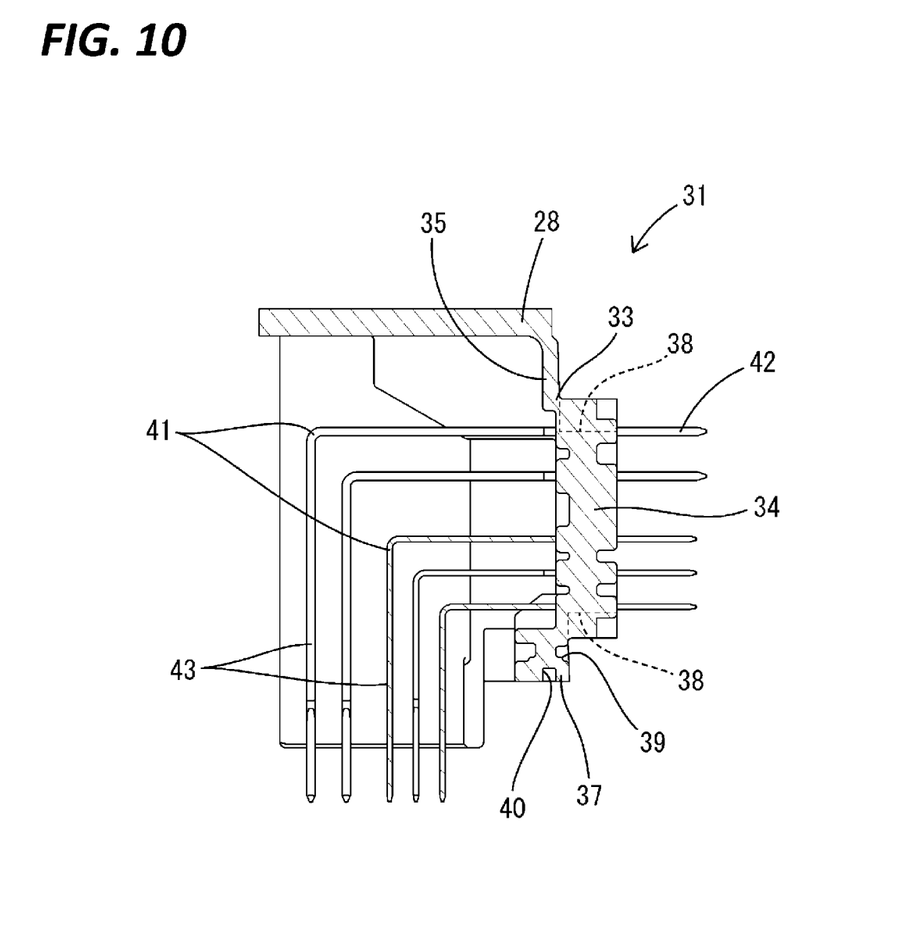
FIG. 10 is a side view in section of the primary molded portion.

The terminal holding member 25 is formed by integrating a primary molded portion 31 and the secondary molded portion 32. The primary molded portion 31 is molded as a single component before being integrated with the secondary molded portion 32. As shown in FIGS. 8 to 10, the primary molded portion 31 is a single member formed by integrating the front wall portion 33 constituting the terminal penetrating portion 26 and the entire protecting portion 28. A region of the front wall portion 33 except an outer peripheral edge part of the front wall portion 33 serves as a press-fitting portion 34. The plurality of press-fit holes 29 described above are formed in the press-fitting portion 34.

An upper edge part 35, both left and right side edge parts 36 and a lower edge part 37, out of a front surface part of the front wall portion 33, surround the press-fitting portion 34 over an entire periphery and is retreated from the press-fitting portion 34 in a stepped manner. Each of the upper surface (outer surface) and the lower surface (outer surface) of the outer periphery of the press-fitting portion 34 is formed with a plurality of (two in this embodiment) first fitting recesses 38 (fitting portion as claimed) spaced apart in a lateral direction.

A plurality of (three in this embodiment) second fitting recesses 39 (fitting portion as claimed) extending straight in the lateral direction are formed in the front surface of the lower edge part 37. A plurality of (three in this embodiment) third fitting recesses 40 (fitting portion as claimed) extending straight in the lateral direction are formed in the lower surface (outer surface) of the lower edge part 37. Regions of the outer surface of the front wall portion 33 where the first to third fitting recesses 38 to 40 are formed serve as contact surfaces with the secondary molded portion 32.

A plurality of terminal fittings 41 are integrated with a region (terminal penetrating portion 26) of the front wall portion 33 of the primary molded portion 31, where the press-fitting portion 34 is formed, by being press-fit. The terminal fitting 41 is formed by bending a metal wire material to have a vertically inverted L shape in a side view. The terminal fitting 41 is composed of a harness connecting portion 42 extending straight in the front-rear direction and a board connecting portion 43 (one end part of a terminal fitting as claimed) extending straight downward from the rear end of the harness connecting portion 42. The terminal fitting 41 is fixed to the primary molded portion 31 by press-fitting the harness connecting portion 42 into the press-fit hole 29 from behind the front wall portion 33. With the terminal fitting 41 fixed, the board connecting portion 43 is accommodated in the protecting portion 28. A length direction of the harness connecting portion 42 is a direction perpendicular to the front surface (surface on which the displacement restricting portion 21 is formed) of the opening 18.

The secondary molded portion 32 is integrated with the primary molded portion 31 and the upper case 12 in a step of insert-molding the secondary molded portion 32. As shown in FIGS. 4 and 6, the secondary molded portion 32 includes the receptacle 27 and an interposed portion 44 constituting the terminal penetrating portion 26. The receptacle 27 collectively surrounds front end parts projecting forward from the front wall portion 33 (terminal penetrating portion 26), out of the harness connecting portions 42 of the terminal fittings 41. A front flange portion 45 protruding radially outward over an entire periphery is formed on a rear end part of the receptacle 27.

The interposed portion 44 is disposed to face the rear surface of the front flange portion 45 and connected to an inner peripheral edge part of the front flange portion 45 over an entire periphery. The interposed portion 44 is composed of a tube portion 46 projecting rearward from the inner peripheral edge part of the front flange portion 45 and a rear flange portion 47 protruding radially outward from the rear end edge of the tube portion 46. A groove portion 54 defined by the front flange portion 45 and the interposed portion 44 (tube portion 46 and rear flange portion 47) is formed over an entire periphery on the outer periphery of the terminal holding member 25 (secondary molded portion 32). The protruding portion 19 of the upper case 12 is fit into this groove portion 54.

The secondary molded portion 32 (interposed portion 44) is formed with a plurality of first fitting projections 48 projecting from the inner peripheral surface of the tube portion 46. The plurality of first fitting projections 48 are individually fit into the plurality of first fitting recesses 38 formed in the upper surface of the outer periphery of the press-fitting portion 34 and the lower surface of the outer periphery of the press-fitting portion 34. A plurality of second fitting projections 49 are formed in a lower edge region facing the front surface of the lower edge part 37 of the primary molded portion 31, out of the rear surface of the rear flange portion 47. The plurality of second fitting projections 49 are individually fit into the plurality of second fitting recesses 39. A plurality of third fitting projections 50 are formed in a region facing the lower surface of the lower edge part 37, out of the rear flange portion 47. The plurality of third fitting projections 50 are individually fit into the plurality of third fitting recesses 40.

Regions of the interposed portion 44 where the first to third fitting projections 48 to 50 are formed serve as contact surfaces with the primary molded portion 31. The inner peripheral surface of the tube portion 46 of the interposed portion 44 also serves as a contact surface with the primary molded portion 31 over an entire periphery. Further, the rear surface of the rear flange portion 47 also serves as a contact surface with the primary molded portion 31. The inner surface of the groove portion 54 (the rear surface of the front flange portion 45, the outer peripheral surface of the tube portion 46 and the front surface of the rear flange portion 47) serves as a contact surface with the case 11 (protruding portion 19) over an entire periphery. Further, an inclination restricting portion 51 continuous over an entire periphery is formed on the outer periphery of a rear end part of the secondary molded portion 32 by the front flange portion 45 and the interposed portion 44 (tube portion 46 and rear flange portion 47).

Next, a manufacturing process of the connector 10 of this embodiment is described. First, the upper case 12 and the lower case 13 are molded into predetermined completed shapes and the primary molded portion 31 is molded into a predetermined completed shape. The plurality of terminal fittings 41 are integrated with the front wall portion 33 of the molded primary molded portion 31 by being mounted through the front wall portion 33. Subsequently, the upper case 12 and the primary molded portion 31 are set in a mold (not shown) for insert molding. With the upper case 12 and the primary molded portion 31 set in the mold, the primary molded portion 31 is accommodated in the upper case 12. The outer peripheral surface of the press-fitting portion 34 of the front wall portion 33 faces the inner peripheral surface of the opening 18 (protruding portion 19) of the upper case 12 over an entire periphery while being spaced apart. The front surfaces of the upper edge part 35, the both left and right side edge parts 36 and the lower edge part 37 of the front wall portion 33 face the rear surface of the protruding portion 19 over an entire periphery while being spaced apart.

The upper surface of the protecting portion 28 is held in surface contact with the upper plate portion 15 of the upper case 12 and both left and right outer side surfaces of the protecting portion 28 are held in close contact with the inner surfaces of the both left and right side plate portions 16 of the upper case 12, whereby the primary molded portion 31 and the upper case 12 are positioned in the vertical and lateral directions. The rear end of the upper wall of the protecting portion 28 comes into contact with the stopper 24 of the upper plate portion 15 from front and unillustrated positioning pins come into contact with the front surface of the press-fitting portion 34, whereby the primary molded portion 31 and the upper case 12 are positioned in the front-rear direction.

By injecting molten resin into the mold in this state, the secondary molded portion 32 is molded into a predetermined shape and cooled and solidified. When the secondary molded portion 32 is solidified, the primary molded portion 31 and the secondary molded portion 32 are integrated, whereby the terminal holding member 25 is integrated with the upper case 12 while penetrating through the opening 18 in the front-rear direction at the same time as the terminal holding member 25 is molded. The integrated upper case 12 and terminal holding member 25 are taken out from the mold.

As shown in FIGS. 4 and 6, with the secondary molded portion 32 molded and integrated with the upper case 12 and the primary molded portion 31, the interposed portion 44 is in a clearance between the protruding portion 19 (opening 18) of the upper case 12 and the front wall portion 33 of the primary molded portion 31 and between the outer periphery of the press-fitting portion 34 and the inner peripheral surface of the protruding portion 19. Then, a plurality of locking recesses 52 and a plurality of locking projections 53 on a front end part of the outer periphery of the tube portion 46 are respectively fit to the restricting projections 22 and the restricting recesses 23 of the case 11. Further, the first, second and third fitting projections 48, 49 and 50 of the interposed portion 44 are respectively fit into the first, second and third fitting recesses 38, 39 and 40.

Similarly, with the secondary molded portion 32 molded and integrated with the upper case 12 and the primary molded portion 31, the protruding portion 19 is fit to bite into the outer periphery (inclination restricting portion 51) of the terminal holding member 25. The front and rear flange portions 45, 47 of the inclination restricting portion 51 sandwich the protruding portion 19 from front and rear sides. The rear surface of the front flange portion 45 comes into contact with the inner and outer peripheral rib-like projections 55, 56 of the protruding portion 19 over the entire periphery from front. The front surface of the rear flange portion 47 comes into surface contact with the rear surface (inner surface) of the protruding portion 19 from behind. Further, the rear surface of the front flange portion 45 is held in close contact with the front surface of the sealing member 20 over the entire periphery, thereby sealing between the front surface of the protruding portion 19 (upper case 12) and the rear surface of the front flange portion 45 (secondary molded portion 32) in a liquid-tight manner.

The upper case 12 integrated with the terminal holding member 25 is united with the lower case 13. When the upper case 12 and the lower case 13 are united, the case 11 is configured and the assembling of the connector 10 is completed. The circuit board 57 is mounted on the lower case 13 in advance. In assembling the upper case 12 and the lower case 13, the board connecting portions 43 of the terminal fittings 41 penetrating through the terminal penetrating portion 26 are inserted into through holes (not shown) of the circuit board 57. The harness connecting portions 42 of the terminal fittings 41 are accommodated into the receptacle 27. A mating connector (not shown) mounted on a wiring harness (not shown) is fit into the receptacle 27 and mating terminals (not shown) of the mating connector are connected to the harness connecting portions 42.

As described above, the connector 10 of this embodiment includes the terminal holding member 25 made of synthetic resin and holding the terminal fittings 41, and the case 11 (upper case 12) made of metal. The case 11 is integrated with the terminal holding member 25, and one end part (board connecting portion 43) of each terminal fitting 41 is accommodated in the case 11. The synthetic resin as a material of the terminal holding member 25 has a larger coefficient of linear expansion than the metal as a material of the case 11. Thus, there is a concern that the case 11 and the secondary molded portion 32 are relatively displaced at the contact surfaces of the case 11 and the secondary molded portion 32 due to a difference in coefficient of linear expansion if the temperature of the connector 10 varies.

As a countermeasure against this, the connector 10 of this embodiment is formed with the displacement restricting portion 21 having an irregular shape on the contact surfaces of the case 11 with the secondary molded portion 32. The irregular shape of the displacement restricting portion 21 in this embodiment is formed by alternately arranging the plurality of wide restricting recesses 23 having a large dimension in the circumferential direction and the plurality of narrow restricting projections 22 having a smaller dimension in the circumferential direction than the restricting recesses 23. Note that examples of the irregular shape other than that in the present disclosure include a shape formed by alternately arranging restricting recesses and restricting projections having the same width at constant intervals, a shape formed by alternately arranging narrow restricting recesses and wide restricting projections, a shape formed by aligning or randomly arranging restricting recesses and the restricting projections on a two-dimensional plane, a shape formed with only a plurality of restricting recesses, a shape formed with only a plurality of restricting projections, a shape formed with slit-like restricting recesses and a shape formed with rib-like projections.

When the case 11 made of metal and the terminal holding member 25 made of synthetic resin are thermally deformed, the case 11 and the terminal holding member 25 are going to be relatively displaced due to a difference between the coefficient of linear expansion of the metal and that of the synthetic resin. However, the locking recesses 52 and the locking projections 53 of the terminal holding member 25 are respectively engaged with the restricting projections 22 and the restricting recesses 23 of the displacement restricting portion 21 on the contact surfaces of the case 11 with the terminal holding member 25. By this engagement, an anchoring effect is achieved in the vertical and lateral directions orthogonal to a penetration direction (front-rear direction) of the terminal holding member 25 through the opening 18.

By this anchoring effect, relative displacements between the case 11 and the terminal holding member 25 are restricted. Even if the case 11 and the terminal holding member 25 are relatively displaced, a clearance formed between the case 11 and the terminal holding member 25 due to relative displacements is suppressed to a minimum level since an amount of displacement is suppressed to be small. If the case 11 is fixed to a body or the like of a vehicle, the vibration of the terminal holding member 25 is suppressed even if the vibration of the wiring harness is transmitted to the terminal holding member 25. As described above, anti-vibration performance can be improved according to the connector 10 of this embodiment.

The case 11 includes the opening 18 through which the terminal holding member 25 penetrates. The displacement restricting portion 21 is disposed along the opening edge part (protruding portion 19) of the opening 18. According to this configuration, the anchoring effect by the displacement restricting portion 21 is achieved along the circumferential direction on the outer periphery of the terminal holding member 25. In other words, the anchoring effect is achieved in such a manner as to surround the terminal holding member 25 over the entire periphery. Therefore, relative displacements between the case 11 and the terminal holding member 25 can be effectively suppressed.

The opening edge part of the opening 18 serves as the plate-like protruding portion 19 protruding inward toward the outer periphery of the terminal holding member 25. The displacement restricting portion 21 is formed on the outer surfaces (front and rear surfaces) of the protruding portion 19. According to this configuration, an anchoring effect in the front-rear direction by the biting of the protruding portion 19 into the outer periphery of the terminal holding member 25 is also achieved in addition to the anchoring effect in two-dimensional directions (vertical and lateral directions) by the displacement restricting portion 21. Therefore, relative displacements between the case 11 and the terminal holding member 25 can be effectively suppressed.

The terminal holding member 25 includes the primary molded portion 31 integrated with the terminal fittings 41 and the secondary molded portion 32 integrated with the primary molded portion 31. The displacement restricting portion 21 is formed on the contact surfaces of the case 11 with the secondary molded portion 32. According to this configuration, in the shape design of the secondary molded portion 32, the reliable contact of the secondary molded portion 32 with the displacement restricting portion 21 can be prioritized over the influence of an injection pressure on the terminal fittings 41. Therefore, the displacement restricting portion 21 and the secondary molded portion 32 can be reliably brought into contact.

Further, since the secondary molded portion 32 is not in contact with the terminal fittings 41, the terminal fittings 41 need not be set in a mold in a step of insert-molding the secondary molded portion 32. Therefore, even if the connector 10 is a multi-pole connector having a large number of the terminal fittings 41, the shape of the mold (not shown) can be simplified.

The secondary molded portion 32 is formed with the interposed portion 44 for filling up the clearance between the secondary molded portion 31 and the upper case 12 (case 11). By sandwiching the interposed portion 44 between the primary molded portion 31 and the case 11, the secondary molded portion 32 is reliably integrated with the case 11 and the primary molded portion 31.

The fitting portion having the irregular shape is formed on the contact surfaces of the primary molded portion 31 with the secondary molded portion 32. The irregular shape of the fitting portion in the first embodiment is formed by the slit-like first fitting recesses 38, the slit-like second fitting recesses 39 and the slit-like third fitting recesses 40.

Note that examples of the irregular shape of the fitting portion other than that in the present disclosure include a shape formed by alternately arranging restricting recesses and restricting projections having the same width at constant intervals, a shape formed by alternately arranging narrow restricting recesses and wide restricting projections, a shape formed by alternately arranging wide restricting recesses and narrow restricting projections, a shape formed by aligning or randomly arranging restricting recesses and restricting projections on a two-dimensional plane, a shape formed with only a plurality of restricting recesses, a shape formed with only a plurality of restricting projections, a shape formed with slit-like restricting recesses and a shape formed with rib-like projections.

The connector 10 of this embodiment includes the upper case 12 (case 11) made of metal and having the opening 18, and the terminal holding member 25 made of synthetic resin for holding the terminal fittings 41, the terminal holding member 25 being integrated with the upper case 12 while penetrating through the opening 18. Although the upper case 12 and the terminal holding member 25 are integrated by insert molding, affinity (adhesion) between the metal and the synthetic resin, which are different types of materials, is not high. Thus, when the connector 10 is subjected to vibration, a clearance may be formed between the terminal holding member 25 and the upper case 12 and the terminal holding member 25 and the upper case 12 may be repeatedly relatively displaced.

The terminal fittings 41 are held in the terminal holding member 25, the circuit board 57 is fixed to the upper case 12, and the board connecting portions 43 of the terminal fittings 41 and the circuit board 57 are fixed by soldering. Thus, if the terminal holding member 25 and the upper case 12 are repeatedly relatively displaced, a stress concentrates on bent parts of the terminal fittings 41 where the harness connecting portions 42 and the board connecting portions 43 are connected.

As a countermeasure against this, the opening 18 is provided with the protruding portion 19 protruding inward toward the outer periphery of the terminal holding member 25 and the terminal holding member 25 is formed with the inclination restricting portion 51. The inclination restricting portion 51 is held in contact with both the outer surface (front surface) and the inner surface (rear surface) of the protruding portion 19 by sandwiching the protruding portion 19 in the front-rear direction. According to this configuration, since the inclination restricting portion 51 is in contact with the protruding portion 19 in the front-rear direction, the inclination of the terminal holding member 25 with respect to the upper case 12 in the vertical and lateral directions is suppressed even if the terminal holding member 25 is subjected to vibration.

Particularly, since the protruding portion 19 is sandwiched when the inclination restricting portion 51 thermally expands, the formation of the clearance between the upper case 12 and the terminal holding member 25 can be effectively suppressed. Further, since the inclination restricting portion 51 sandwiches the protruding portion 19, the inclination of the terminal holding member 25 with respect to the upper case 12 (case 11) can be effectively suppressed without complicating the structure.

The terminal holding member 25 includes the primary molded portion 31 integrated with the terminal fittings 41 and the secondary molded portion 32 integrated with the primary molded portion 31. The inclination restricting portion 51 is formed only on the secondary molded portion 32. According to this configuration, in the shape design of the secondary molded portion 32, the reliable contact of the inclination restricting portion 51 with the protruding portion 19 can be prioritized over the influence of an injection pressure on the terminal fittings 41. Therefore, the inclination restricting portion 51 can be reliably brought into contact with the protruding portion 19.

The secondary molded portion 32 includes the interposed portion 41 for filling up the clearance between the primary molded portion 31 and the upper case 12, and the interposed portion 44 is formed with the inclination restricting portion 51. According to this configuration, the primary molded portion 31 and the upper case 12 can be integrated via the interposed portion 44. Since the interposed portion 44 also functions as the inclination restricting portion 51, the secondary molded portion 32 can be simplified as compared to the case where the inclination restricting portion 51 is formed on a location different from the interposed portion 44. Further, since the interposed portion 44 and the inclination restricting portion 51 are sandwiched between the primary molded portion 31 and the protruding portion 19, the inclination restricting portion 51 is reliably integrated with the protruding portion 19.

The opening edge part (protruding portion 19) of the opening 18 is provided with the sealing member 20 disposed to surround the terminal holding member 25. The sealing member 20 is sandwiched between the protruding portion 19 and the terminal holding member 25 and seals the clearance between the opening 18 and the outer periphery of the terminal holding member 25 over the entire periphery. According to this configuration, sealing can be provided between the case 11 and the terminal holding member 25 in a liquid-tight manner.

Other Embodiments

The present invention is not limited to the above described and illustrated embodiment, but is represented by claims. The present invention is intended to include all changes in the scope of claims and in the meaning and scope of equivalents and include also embodiments as described below.

Although the inclination restricting portion of the terminal holding member sandwiches the protruding portion (opening edge part of the opening) from both inner and outer sides in the above embodiment, the terminal holding member may be in contact with only either one of the outer and inner surfaces of the protruding portion.

Although the protruding portion (opening edge part of the opening) to be sandwiched by the inclination restricting portion surrounds the terminal holding member over the entire periphery in the above embodiment, the protruding portion may correspond to only a part of the outer periphery of the terminal holding member.

Although the sealing member is provided on the outer surface of the protruding portion in the above embodiment, the sealing member may be provided on the inner surface of the protruding portion.

Although the sealing member is provided between the case and the terminal holding member in the above embodiment, the sealing member may not be provided between the case and the terminal holding member.

Although the fitting portion has the irregular shape formed by the plurality of recesses in the above embodiment, the irregular shape of the fitting portion may be a shape formed by alternately arranging recesses and projections having the same width at constant intervals, a shape formed by alternately arranging narrow recesses and wide projections, a shape formed by alternately arranging wide recesses and narrow projections, a shape formed by aligning or randomly arranging recesses and projections on a two-dimensional plane, or the like.

Although the fitting portion having the irregular shape is formed on the contact surfaces of the primary molded portion with the secondary molded portion in the above embodiment, such a fitting portion may not be formed.

Although the secondary molded portion is formed with the interposed portion for filling up the clearance between the primary molded portion and the case and the interposed portion is formed with the inclination restricting portion in the above embodiment, the interposed portion may not be formed with the inclination restricting portion.

Although the terminal holding member is composed of the primary molded portion and the secondary molded portion in the above embodiment, the terminal holding member may be composed only of the primary molded portion.

Although the displacement restricting portion has the irregular shape by alternately arranging the narrow projections and the wide recesses in the above embodiment, the irregular shape of the displacement restricting portion may be a shape formed by alternately arranging recesses and projections having the same width at constant intervals, a shape formed by alternately arranging narrow recesses and wide projections, a shape formed by aligning or randomly arranging recesses and projections on a two-dimensional plane, or the like.

Although the displacement restricting portion is formed on the surface of the opening (protruding portion) substantially perpendicular to the length direction of the harness connecting portions of the terminal fittings in the above embodiment, the displacement restricting portion may be formed on a surface of the opening parallel to the length direction of the harness connecting portions.

Although the displacement restricting portion is disposed to surround the outer periphery of the terminal holding member over the entire periphery in the above embodiment, the displacement restricting portion may be disposed only in a region corresponding to a part of the outer periphery of the terminal holding member.

Although the displacement restricting portion is formed only on the outer surface of the protruding portion (opening edge part of the opening) in the above embodiment, the displacement restricting portion may be formed only on the inner surface of the protruding portion or may be formed on both the inner and outer surfaces of the protruding portion.

Although the case includes the displacement restricting portion in the above embodiment, the case may not include the displacement restricting portion.

LIST OF REFERENCE NUMERALS

10: connector
11: case
12: upper case
13: lower case
14: front plate portion
15: upper plate portion
16: side plate portion
17: rear plate portion
18: opening
19: protruding portion
20: sealing member
21: displacement restricting portion
22: restricting projection
23: restricting recess
24: stopper
25: terminal holding member
26: terminal penetrating portion
27: receptacle
28: protecting portion
29: press-fit hole
31: primary molded portion
32: secondary molded portion
33: front wall portion
34: press-fitting portion
35: upper edge part
36: left and right side edge parts
37: lower edge part
38: first fitting recess (fitting portion)
39: second fitting recess (fitting portion)
40: third fitting recess (fitting portion)
41: terminal fitting
42: harness connecting portion
43: board connecting portion (one end part of terminal fitting)
44: interposed portion
45: front flange portion
46: tube portion
47: rear flange portion
48: first fitting projection
49: second fitting projection
50: third fitting projection
51: inclination restricting portion
52: locking recess
53: locking projection
54: groove portion
55: inner peripheral rib-like projection
56: outer peripheral rib-like projection
57: circuit board

What is claimed is:

1. A connector, comprising:
a case made of metal and including an opening; and
a terminal holding member made of synthetic resin and including a groove formed along an outer periphery of the terminal holding member, the terminal holding member being configured to hold a terminal fitting and integrated with the case while penetrating through the opening,
wherein:
the opening of the case includes a protruding portion protruding inward to be fit into the groove of the terminal holding member, and
the terminal holding member includes an inclination restricting portion held in contact with both a front surface and a rear surface of the protruding portion that is fit into the groove of the terminal holding member.

2. The connector of claim 1, wherein the inclination restricting portion is in contact with the outer and inner surfaces of the protruding portion.

3. The connector of claim 1, wherein:
the terminal holding member includes a primary molded portion integrated with the terminal fitting and a secondary molded portion integrated with the primary molded portion, and
the inclination restricting portion is formed on the secondary molded portion.

4. The connector of claim 3, wherein:
the secondary molded portion includes an interposed portion configured to fill up a clearance between the primary molded portion and the case, and
the interposed portion is formed with the inclination restricting portion.

5. The connector of claim 3, wherein a fitting portion having an irregular shape is formed on a contact surface of the primary molded portion with the secondary molded portion.

6. The connector of claim 1, wherein the protruding portion is provided with a sealing member configured to seal a clearance between the terminal holding member and the protruding portion in a liquid-tight manner over an entire periphery.

7. The connector of claim 1, wherein the inclination restricting portion of the terminal holding member includes a front flange and a rear flange that contact the front surface and the rear surface of the protruding portion, respectively.

8. The connector of claim 7, wherein the front flange and the rear flange of the terminal holding member sandwich the protruding portion in a front-rear direction in the groove.

* * * * *